(12) United States Patent
Singh et al.

(10) Patent No.: US 11,114,175 B1
(45) Date of Patent: Sep. 7, 2021

(54) SYSTEMS AND METHODS FOR PROVIDING A READ ONLY MEMORY CELL ARRAY

(71) Applicant: QUALCOMM Incorporated, San Diego, CA (US)

(72) Inventors: Paramjeet Singh, Brampton (CA); Bipin Duggal, Irvine, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/986,541

(22) Filed: Aug. 6, 2020

(51) Int. Cl.
*G11C 17/12* (2006.01)

(52) U.S. Cl.
CPC .................. *G11C 17/126* (2013.01)

(58) Field of Classification Search
CPC ...................................... G11C 17/126
See application file for complete search history.

(56) References Cited

U.S. PATENT DOCUMENTS

| | | |
|---|---|---|
| 6,002,607 A | 12/1999 | Dvir |
| 6,081,456 A | 6/2000 | Dadashev |
| 6,642,587 B1 | 11/2003 | Poplevine et al. |
| 6,826,070 B2 | 11/2004 | Sung et al. |
| 7,002,827 B1 | 2/2006 | Sabharwal et al. |
| 7,075,809 B2 | 7/2006 | Jeung et al. |
| 7,179,712 B2 | 2/2007 | Hoefler |
| 7,215,563 B2 | 5/2007 | Brandon et al. |
| 7,447,074 B2 | 11/2008 | Jacquet |
| 7,920,403 B2 | 4/2011 | Liaw |
| 7,936,578 B2 | 5/2011 | Nevers et al. |
| 8,059,442 B2 | 11/2011 | Alami et al. |
| 8,106,463 B2 | 1/2012 | Moharir et al. |
| 8,406,031 B2 | 3/2013 | Buer et al. |
| 8,837,192 B2* | 9/2014 | Wu .................. G11C 11/5692 365/63 |
| 9,286,998 B1 | 3/2016 | Singh et al. |
| 9,966,150 B2* | 5/2018 | Rawat .................. G11C 17/126 |
| 2008/0170426 A1* | 7/2008 | Liaw ................ H01L 27/11226 365/104 |
| 2011/0211382 A1 | 9/2011 | Sharma et al. |
| 2014/0112048 A1* | 4/2014 | Wu ....................... G11C 5/025 365/63 |
| 2017/0025185 A1* | 1/2017 | Rawat ............... H01L 27/11213 |

* cited by examiner

*Primary Examiner* — Xiaochun L Chen
(74) *Attorney, Agent, or Firm* — Haynes and Boone, LLP

(57) ABSTRACT

A Read Only Memory (ROM) cell array includes: a first transistor coupled to a first word line; a second transistor coupled to a second word line; and a third transistor disposed between the first transistor and the second transistor, the third transistor having a first gate terminal permanently coupled to a power rail.

26 Claims, 8 Drawing Sheets

SYSTEMS AND METHODS FOR PROVIDING
A READ ONLY MEMORY CELL ARRAY

TECHNICAL FIELD

This application relates to Read Only Memory (ROM) and, more specifically, to ROM cell arrays having at least one transistor configured to be maintained in an off state when the chip is powered up.

BACKGROUND

A mobile computing device, such as a smart phone, contains a multi-processor chip to provide computing power. The multi-processor chip has secure data stored thereon in a Read Only Memory (ROM) cell array. An example of a ROM cell array includes multiple transistors having gates coupled to word lines and sources or drains coupled to bit lines. A given transistor may store a bit by having its source or drain either coupled to ground or not coupled to ground by use of a via. For example, a via may connect the source or drain to ground so that when the transistor is turned on it causes a low voltage to appear at the bit line (a digital zero) or a via may be absent so that when the transistor is turned on a high voltage appears at the bit line (a digital one). These vias are placed during manufacture of the processor chip, so that the data stored by placing the vias is considered read-only after programming.

Continuing with the example, the secure data may be read during power on or boot up of the chip. Examples of secure data that may be stored include a security code for the processor chip, boot code for the processor chip, configurations to enable chip boot, and the like. As processor chips become more sophisticated, this secure data may increase in size with each new processor chip version or generation. The ROM cell array is implemented in hardware, which occupies space on the chip, and it is generally desirable to decrease the size of the ROM cell array.

One example ROM cell array includes a multitude of transistors, each of the transistors corresponding to a respective word line. Each alternate transistor is separated from one adjacent transistor by a break. The breaks separating transistors may be relatively large, and, in fact, may be larger in some dimensions than the transistors themselves. With thousands, or even millions, of such breaks, the overall size of the ROM cell array may occupy and undesirably large portion of silicon area.

There is currently a need for a ROM cell arrays having a more compact physical structure.

SUMMARY

Various implementations include ROM cell arrays having space-saving architectures. For instance, some implementations may utilize transistors to separate word line transistors. The transistors that are used to separate may be smaller in some dimensions than the breaks used in other ROM cells, thereby providing a space savings on the whole for the array.

In one implementation, a Read Only Memory (ROM) cell array including: a first transistor coupled to a first word line; a second transistor coupled to a second word line; and a third transistor disposed between the first transistor and the second transistor, the third transistor having a first gate terminal permanently coupled to a power rail.

In another implementation, a method of reading a read-only memory (ROM) cell array having a first transistor corresponding to a first word line and a second transistor corresponding to a second word line, the method including: applying a first signal on the first word line to read data stored to the first transistor; applying a second signal on the second word line to read data stored to the second transistor; and maintaining a third transistor in an off state during reading the data stored to the first transistor and during reading the data stored to the second transistor, wherein the third transistor is disposed in series between the first transistor and the second transistor.

In another implementation, a system on chip (SOC) having a read only memory (ROM) unit, the ROM unit including: a first group of transistors, each storing data and coupled to a first group of word lines; a second group of transistors, each storing data and coupled to a second group of word lines; and a dummy word line transistor isolating the first group of transistors from the second group of transistors, the dummy word line transistor being permanently in an off state.

In yet another implementation, a read only memory (ROM) cell array including: first means for storing first data, the first means associated with a first word line and a first bit line; second means for storing second data, the second means associated with a second word line and a second bit line; and means for isolating the first means from the second means, the isolating means being arranged between the first means and the second means on a semiconductor substrate, the first means, the second means, and the isolating means being arranged along a length dimension of the first bit line and the second bit line, the isolating means including a transistor configured to be held permanently in an off state during operation of a chip on which the ROM cell array is implemented.

DETAILED DESCRIPTION

Figure 1:
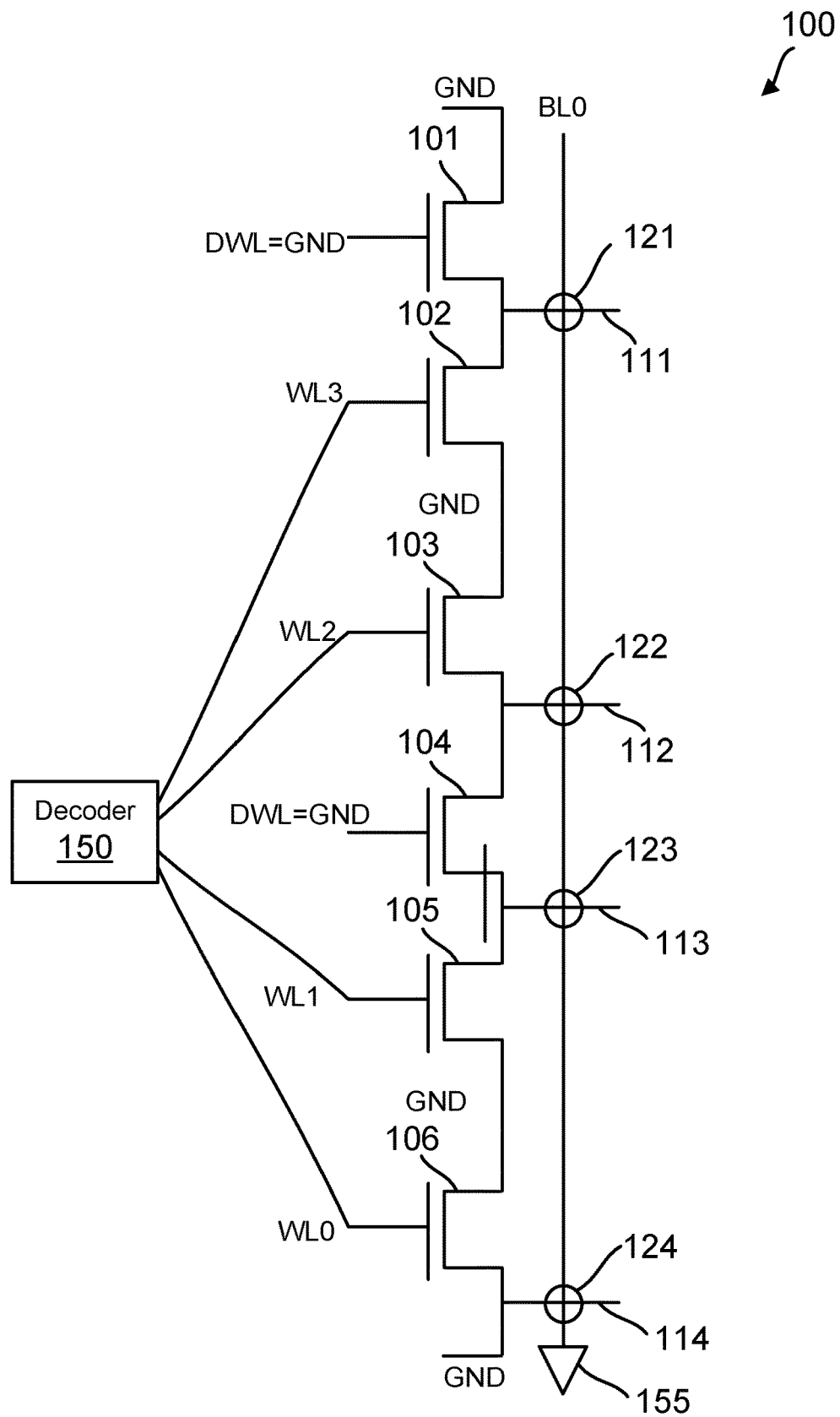
FIG. 1 is an illustration of an example ROM cell array, according to one implementation.

Various implementations provide for a read only memory (ROM) cell array that isolates transistors using dummy word line transistors. In one example, a ROM cell includes a transistor that stores one or more data bits, and a cell array includes multiple transistors, each transistor storing one or more data bits. An example ROM cell array may include a first transistor that is coupled to a first word line and a second transistor that is coupled to a second word line. The first transistor and the second transistor are isolated from each other by the third transistor that is disposed therebetween. The third transistor has a gate terminal that is permanently coupled to a power rail. For instance, the third transistor may include a N-channel Metal Oxide Semiconductor (NMOS)

transistor coupled to ground or voltage source-source (VSS) at its gate. In general, an NMOS transistor is in an off state when its gate is at ground, therefore, the third transistor is off when the chip is powered up.

In another example, the third transistor may include a P-channel Metal Oxide Semiconductor (PMOS) transistor. In general, a PMOS transistor is in an off state when its gate voltage is higher than its source voltage. In the PMOS example, the gate of the third transistor may be coupled to voltage drain-drain (VDD), thereby causing a positive gate source voltage and keeping the PMOS transistor off when the chip is powered up.

Each of the word line transistors may be configured to store one bit or multiple bits, as explained in more detail with respect to FIGS. 1-5. In an implementation in which each word line transistor stores a single bit, the ROM cell array may be programmed by either placing or not placing a transistor between the bit line and a common node, where the common node is coupled to a terminal, e.g., a source or a drain, of a word line transistor. The bit line may be pre-charged, and when a word line transistor is turned on, it either discharges the bit line to ground (assuming the via makes electrical communication between the bit line and the common node) or does not discharge the bit line (assuming no via).

Continuing with the example, other implementations may store multiple bits, such as two bits, per word line transistor. Such an implementation may include two bit lines and one source line, where the bit lines and the source line are pre-charged. Vias may be either placed or not placed to make electrical contact between individual ones of the bit lines and source line and a common node at a terminal of the word line transistor. A first logic gate, e.g. an AND gate, and a second logic gate, e.g. an AND gate, may each be coupled to a different combination of the source line and bit lines. Each one of the logic gates outputs a respective bit stored by the word line transistor.

During operation of an example ROM cell array, a single word line is selected at a given time, though each of the bit lines and source line may be common among the word lines. One example implementations may provide separate bit lines and source lines for at least some of the word line transistors. Such an implementation may increase the amount of metal lines in the physical structure of the chip but may increase performance by reducing parasitic capacitance. An example implementation is described in more detail below with respect to FIG. 5.

Some implementations may include methods of operating a ROM cell array, such as the ROM cell arrays described herein. An example method may include applying a first signal on a first word line to read data stored to a first transistor. The method may further include applying a second signal on a second word line to read data stored to a second transistor. A third transistor is then maintained in an off state during reading the data stored to the first transistor and during reading data stored to the second transistor. The third transistor is disposed in series between the first transistor and the second transistor and provides isolation for the first transistor and the second transistor. The third transistor may include an NMOS transistor that is gate-coupled to ground or and PMOS transistor that is gate-coupled to a power source, such as VDD.

Various implementations may include advantages over other systems. An example other system provides isolation between word line transistors by using a break in the structure. An example break may include a silicon and metal structure added at design time and manufactured on the wafer with the ROM cell array. The wafer fabricator may then, during some point in the process, remove the silicon and metal structure, thereby leaving an empty space that is later filled with dielectric or other insulative material. Such a break may conform to spacing rules that require a certain Y dimension size for the break. The total Y dimension size of the ROM cell array includes the Y dimensions of its word line transistors plus its Y dimensions of its breaks.

By contrast, various implementations described herein do not use breaks to isolate word line transistors. Instead, various implementations isolate word line transistors using transistors that are maintained in an off state when the chip is powered up. According to some spacing rules, the isolating transistors may have a smaller Y dimension footprint than a corresponding break would have. As a result, the total Y dimension size of the ROM cell array may be smaller than a total Y dimension size of another ROM cell array that uses breaks.

In other words, ROM cell arrays according to various implementations described herein may provide for a smaller area, which may advantageously allow designers to use the saved chip area for other things, such as random access memory (RAM), processing circuits, and the like. Space savings gained from a more compact ROM cell array may benefit new technologies that call for smaller area, lower power, and higher efficiency. Such technologies may include fifth generation (5G) communication technologies, Internet of things (IOT) technologies, and the like. In 5G, the increasing demand for a large feature set and more source code on a given system on chip (SOC) has increased the demand for ROM significantly over the last several years. A more compact ROM cell array, such as that described herein, may allow for more code to be saved to the ROM per given area, which is generally seen as advantageous for technologies, such as 5G and IOT.

FIG. 1 is a simplified diagram illustrating an example ROM cell array 100, according to one implementation. ROM cell array 100 is shown in FIG. 1 by itself, but it is understood that may be included in a processing device, such as a central processing unit (CPU), digital signal processor (DSP), a system on chip (SOC) having multiple processing cores on a chip, a package including multiple chips, and/or the like.

According to examples herein, the processing device in which ROM cell array 100 is implemented may include a tablet computer, a smart phone, or other appropriate device. However, the scope of implementations is not limited to a smart phone or tablet computer, as other implementations may include a laptop computer or other appropriate device. In fact, the scope of implementations includes any appropriate computing device, whether mobile or not.

ROM cell array 100 includes four word line transistors 102, 103, 105, and 106, each of which stores a single bit of data (either a digital one or a digital zero). Each of the word line transistors 102, 103, 105, 106 is associated with a corresponding word line WL0-WL3. Word line WL1 is isolated from word line WL2 by transistor 104. The gate of transistor 104 is permanently coupled to a power rail, in this case, ground. The abbreviation DWL indicates that transistor 104 is used as a dummy word line because it does not store or access any data, rather, transistor 104 simply provides isolation. In another implementation, transistor 104 may be implemented as a PMOS transistor and have its gate permanently coupled to VDD or another power supply to create a positive gate-source voltage.

Similarly, transistor 101 is also used as a dummy word line. Although FIG. 1 does not show transistor 101 isolating transistor 102 from another word line transistor, it is understood that the scope of implementations may include further transistors coupled in series above transistor 101 before being terminated by ground. In fact, the scope of implementations may include any appropriate number of word line transistors coupled in series as long as appropriate isolation is used between various ones of the transistors.

ROM cell array 100 also includes bit line BL0, which extends along a Y dimension of the series-coupled chain of transistors. The ROM cell array 100 is programmed by placement of vias 121-124 at common nodes 111-114. Looking for example at via 121, it makes electrical contact from common node 111 to bit line BL0. When word line WL3 is selected by decoder 150, BL0 having been precharged then discharges to ground. The sense amplifier 155 detects the low voltage value as a digital zero.

Continuing with the example, the decoder 150 may be used to select any one of the word lines WL0-WL3 at a given time to read a bit stored by its corresponding word line transistor 102, 103, 105, and 106. While FIG. 1 shows each of the word line transistors 102, 103, 105, and 106 programmed with a zero using respective vias 121, 122, 123, and 124, it is understood that the scope of implementations may include any digital values stored to a given one of the word line transistors. For instance, instead of a zero being stored at word line transistor 103, an alternative implementation might include omitting via 122. In such an instance, when the decoder 150 selects word line WL2, the precharged bit line BL0 is not discharged to ground, and the high voltage is detected by the sense amplifier 155 as a digital one. The same is true of the inclusion or omission of any of the vias 121-124.

Sense amplifier 155 may act as a comparator by receiving a signal at a particular voltage level from a respective column. A given sense amplifier includes an input to receive the signal from BL0 as well as an input (not shown) to receive a reference voltage. Sense amplifier 155 compares the signal from BL0 to the reference voltage and outputs either a high or low voltage value in response thereto. For instance, if the voltage signal received from BL0 is lower than the reference voltage, then the sense amplifier may output a low voltage. On the other hand, if the voltage signal received from BL0 is higher than the reference voltage, then the sense amplifier 155 may output a high voltage.

The scope of implementations is not limited to any particular sense amplifier technology. Furthermore, the implementations of FIGS. 2-5 omit sense amplifiers for ease of illustration, but it is understood that sense amplifiers may be used to detect a stored value in a same or similar manner as that described with respect to FIG. 1.

Figure 2:
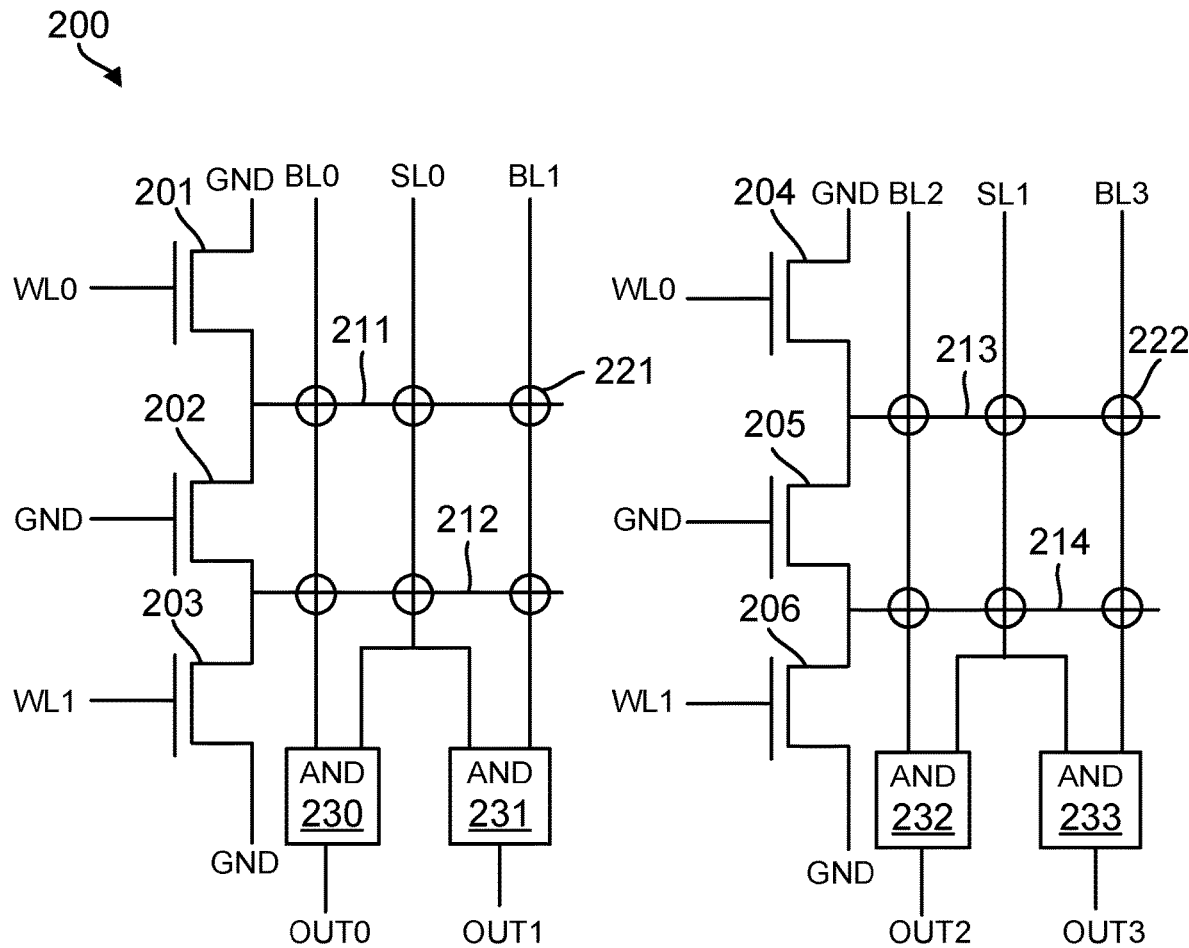
FIG. 2 is an illustration of an example ROM cell array, according to one implementation.

FIG. 2 is a simplified diagram of a ROM cell array 200, according to one implementation. ROM cell array 200 includes a left-hand column and a right-hand column. The left-hand column includes word line transistors 201, 203 isolated from each other by a dummy word line transistor 202. The right-hand column includes word line transistors 204, 206 isolated from each other by dummy word line transistor 205.

Each of the transistors 201, 203, 204, 206 stores a pair of bits in this example. Looking at the left-hand column first, it includes two bit lines BL0 and BL1 as well as a source line SL0. Word line transistor 201 is associated with common node 211, and word line transistor 203 is associated with a common node 212. The bits are programmed by either inclusion or omission of a via, as exemplified by vias 221, 222. Each via electrically couples either a bit line or a source line to one of the common nodes 211-214.

FIG. 2 shows the left-hand column including six different vias, though the scope of implementations may include any appropriate arrangement of vias. Via programming for the left-hand column is given by the truth table at the bottom of FIG. 2. In this example, all six vias on the left-hand side correspond to no particular bit storage and in some examples may be a prohibited programming state. Nevertheless, all six vias are shown on the left-hand side to illustrate where vias may be placed. In one example, to store two zeros at word line transistor 201, a via would be placed to electrically couple the source line SL0 to the common node 211 while neither BL0 nor BL1 would have via. This state is described in the first row of the truth table.

Looking at the second row of the truth table, to store a digital zero and a digital one at word line transistor 201, a via would be placed to create electrical contact between BL1 and the common node 211 while neither the source line SL0 nor the bit line BL0 would have vias.

Looking at the third row of the truth table, to store a digital one and a digital zero at word line transistor 201, a via would be placed to create electrical contact between bit line BL0 and the common node 211. Neither the source line SL0 nor the bit line BL1 would have vias.

Similarly, to store two digital ones at the word line transistor 201, the fourth row of the truth table indicates that no vias would be used to make a connection between any of BL0, BL1, SL0 and the common node 211. The truth table applies to the word line transistor 203 as well. Specifically, the truth table indicates which vias should be used to create electrical contact with common node 212.

The left-hand column includes two logic gates 230, 231, which in this example are AND gates. Logic gate 230 is coupled to bit line BL0 and source line SL0. The logic gate 231 is coupled to source line SL0 and bit line BL1. The logic gates 230, 231 are common to (or shared by) the word line transistors 201, 203. Specifically, the logic gates 230, 231 are configured to output bits stored by both word line transistors 201, 203, as explained in the truth table.

The truth table applies just as well to the right-hand column as well. Specifically, even though the truth table refers to SL0, BL1, and BL0, it is understood that it may refer just as well to SL1, BL2, and BL3. Furthermore, the truth table may be used to specify placement of vias to make electrical contact between common node 213 and SL1, BL2, and BL3 to store two different binary bits at word line transistor 204. The truth table may also be used to specify placement of vias to make electrical contact between common node 214 and SL1, BL2, and BL3. Once again, the logic gates 232, 233 are configured to output the bits stored by the word line transistors 204, 206 as described in the truth table.

In this example, the left-hand column and right-hand column together illustrate a structure to store eight bits using two word lines and dual sets of source lines and bit lines. This is an example, as various implementations may be scaled as appropriate to meet any particular design constraint. For instance, the left-hand and right-hand columns may be scaled to include more word lines and dummy word lines. Furthermore, more columns may be added.

Figure 3:
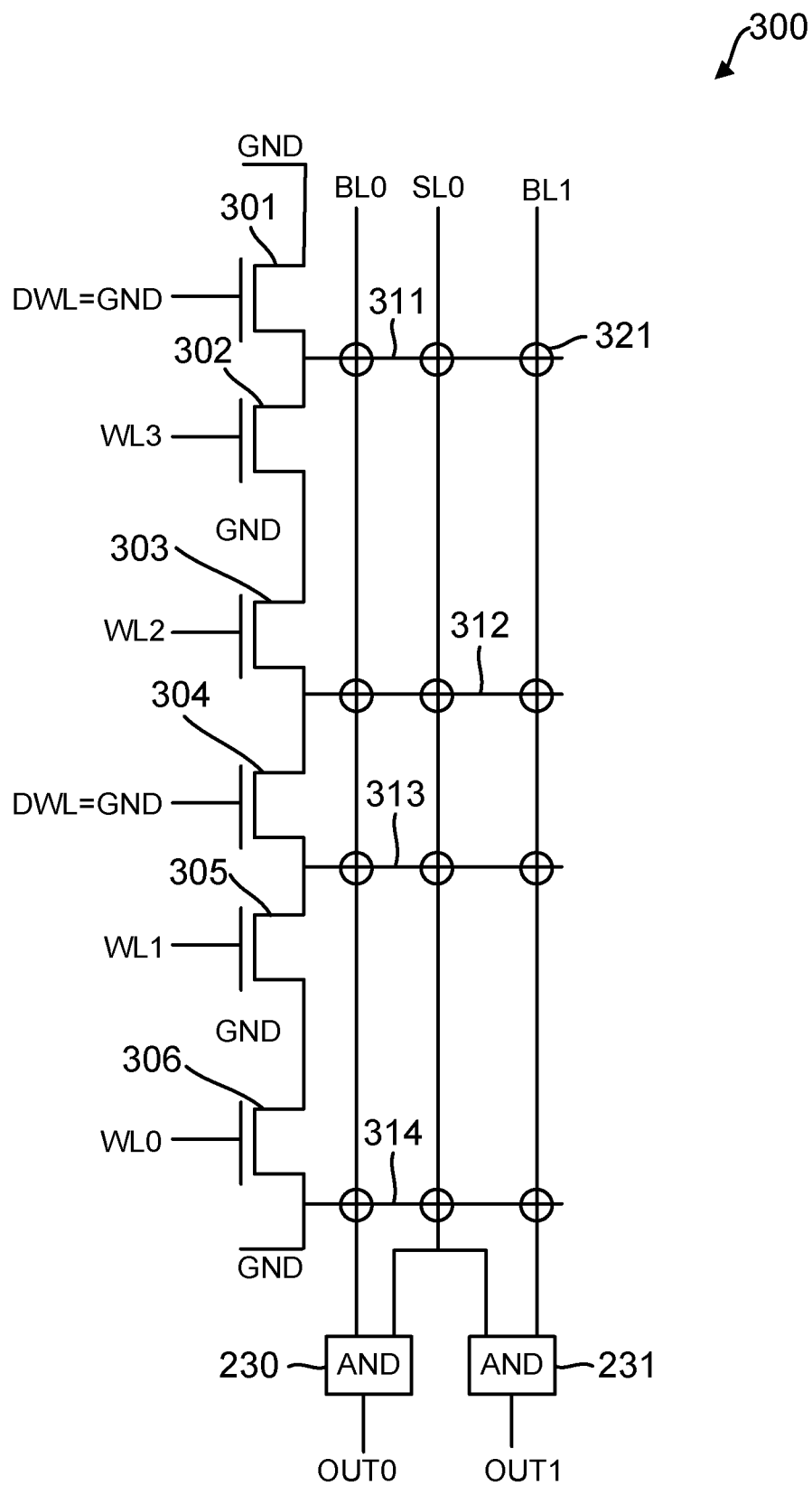
FIG. 3 is an illustration of an example ROM cell array, according to one implementation.

FIG. 3 is a simplified diagram of an example ROM cell array 300, according to one implementation. FIG. 3 is offered to show that the right-hand and left-hand columns of FIG. 2 can be extended to include more word line transistors and dummy word lines as appropriate.

ROM cell array 300 includes word line transistors 302, 303, 305, 306. ROM cell array 300 also includes dummy word line transistors 301, 304. Dummy word line transistor 304 isolates word line transistors 303 and 305. In this implementation, dummy word line transistors 301 and 304 are NMOS transistors that are permanently gate-coupled to ground so that they remain off when the chip is powered up. Alternatively, dummy word line transistors 301 and 304 may be implemented as PMOS transistors that are permanently gate-coupled to a power source, such as VDD.

Via 321 exemplifies the twelve vias shown in FIG. 3. Even though FIG. 3 shows all twelve vias, it is understood that some pattern of vias appropriate to store two data bits at each of the word line transistor 302, 303, 305, 306 may be used. Looking at word line transistor 302 first, it is coupled to word line WL3. It stores two bits of data using some combination of inclusion or omission of vias to either create or omit electrical contact with common node 311. The truth table of FIG. 2 applies just as well to word line transistors of FIG. 3 as to FIG. 2.

Looking next at word line transistor 303, it is coupled to word line WL2 and common node 312. It also stores two digital bits according to the truth table of FIG. 2. Word line transistor 305 is coupled to word line WL1 and common node 313, and word line transistor 306 is coupled to word line WL0 and common node 314. Both word line transistors 305, 306 store two bits of data according to the truth table of FIG. 2.

ROM cell array 300 employs logic gates 230 and 231 in a same or similar manner as the logic gates 230 and 231 are applied in FIG. 2.

Figure 4A:
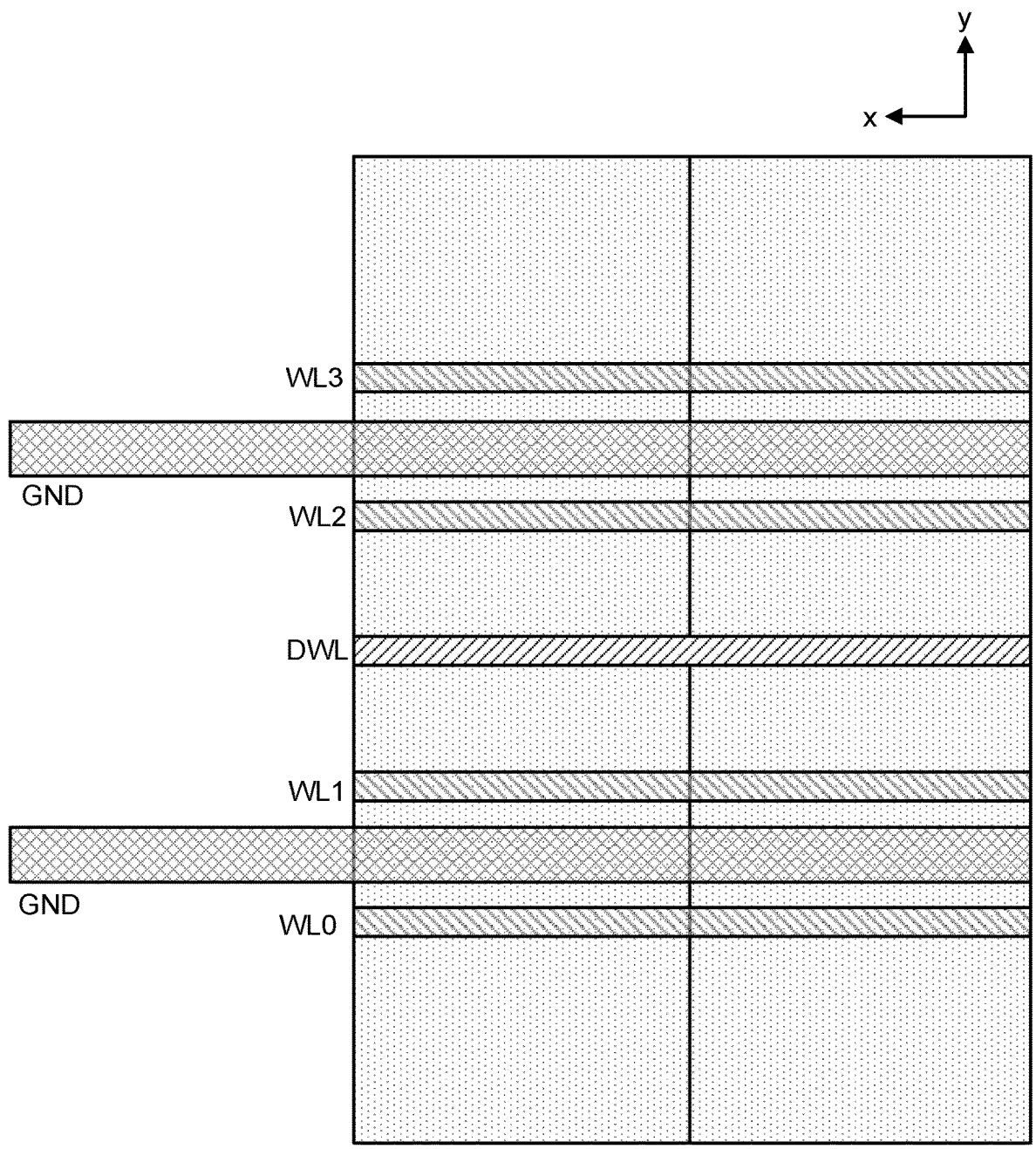
FIGS. 4A and 4B illustrate an example ROM cell array, as built on a chip, according to one implementation.
Figure 4B:
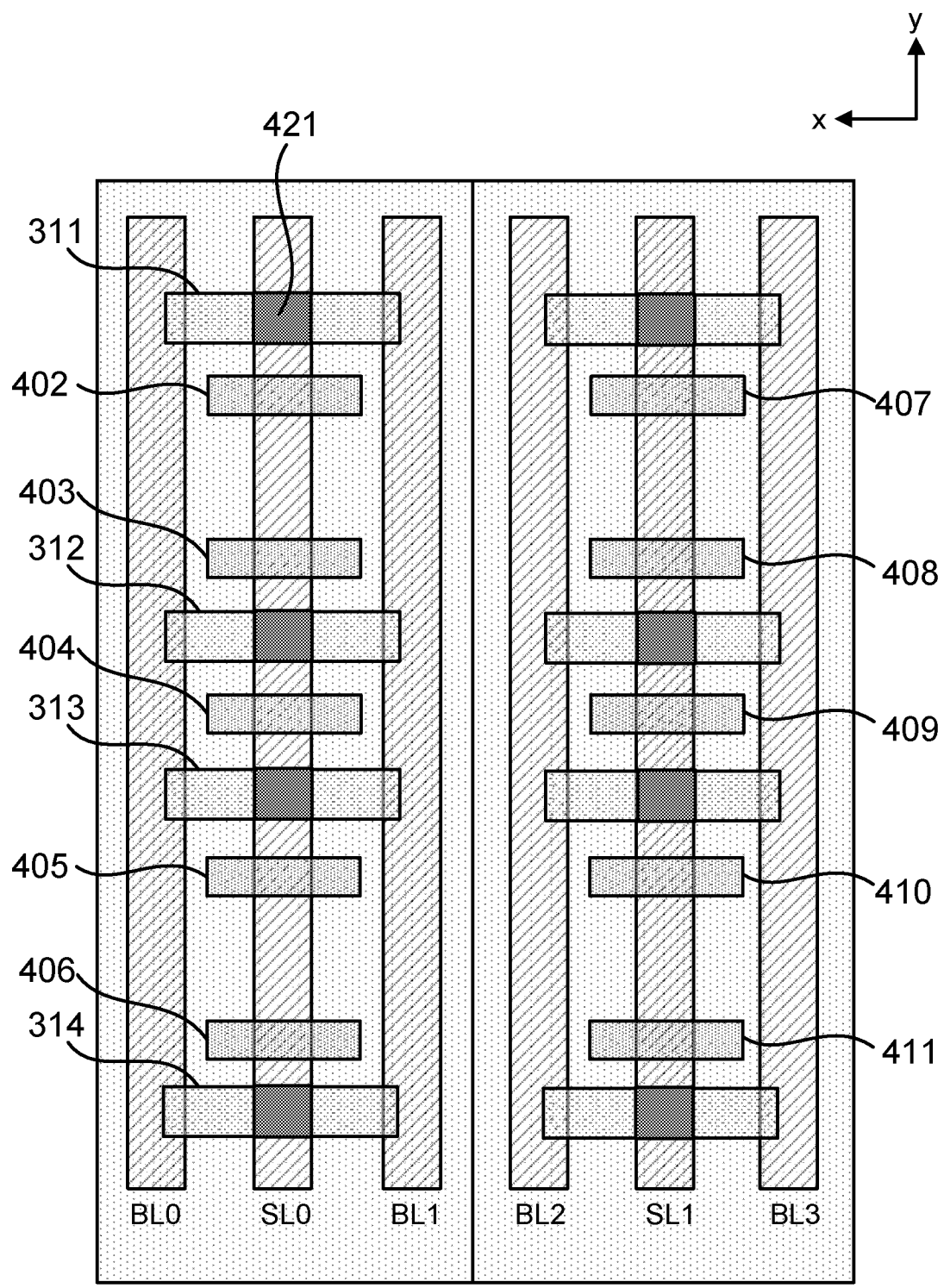

FIGS. 4A and 4B are illustrations of physical structures that may be used to build the example ROM cell array 300 of FIG. 3, according to one implementation. For ease of illustration, FIGS. 4A and 4B are shown separately, but it is understood that they may be combined to collectively show a top-down view of the structures depicted in FIG. 3. Furthermore, whereas FIG. 3 only shows a single column, FIGS. 4A and 4B illustrate two columns that share ground rails and word lines. The scope of implementations is not limited to either one or two columns; rather, various implementations may include any number of columns as appropriate, and this is true for any of the implementations shown in FIGS. 1-5.

FIG. 4A illustrates the ground rails GND, the word lines WL0-WL3 and dummy word line DWL, which corresponds to the dummy word line coupled to dummy word line transistor 304 of FIG. 3. FIGS. 4A and 4B omit the dummy word line corresponding to transistor 301 for ease of illustration.

Looking at the left-hand column first, the common nodes 311-314 are shown in FIG. 4B, and they may be built in any appropriate metal layer, such as in a metal layer that is above the transistors 302-306 but below the uppermost metal layers that include source line SL0 and bit lines BL0, BL1. For instance, the common nodes 311-314 may be built in a metal layer M1, whereas the source line SL0 and bit lines BL0, BL1 may be built in an upper metal layer M2. Each of the metal layers may be separated by semiconductor material or dielectric material. The layers below the metal layers may include doped semiconductor material in which the gates, sources, drains, and channels of the transistors 302-306 are built. The right-hand column is built in the same way, and it includes source line SL1 and bit lines BL2, BL3 and its own respective transistors. The left-hand column and right-hand column share the word lines WL0-WL3 and the ground rails GND.

FIG. 4B illustrates the metal structures corresponding to bit lines BL0-BL3 and source lines SL0, SL1. FIG. 4B also illustrates vias 421 making electrical contact between source lines SL0, SL1 and the various common nodes. This is done for illustrative purposes only, and it is understood that vias may be placed in any appropriate manner according to the truth table of FIG. 2 to store two digital bits at each transistor. For instance, vias 421 are placed at SL0, SL1 only, which is different from the placement of vias 321 in FIG. 3, and other implementations may place vias in any appropriate position according to the truth table.

Looking once again to the left-hand column, the transistors are built in the underlying semiconductor layers using complementary metal oxide semiconductor (CMOS) processing. In this top down view, the transistors are below the metal layers and they are shown by the boxes 402-411, where boxes 402-406 correspond to transistors 302-306 of FIG. 3. Transistors represented by boxes 407-412 would be similarly built in the right-hand column as well. Of note in FIG. 4B is that the Y dimension width of the boxes 402-411 is less than what would be expected for a Y dimension width of a break in another ROM cell array. In fact, Y dimension width of the boxes 402-411 may be half or less what would be expected of a break in another ROM cell array. In other words, the implementation of FIGS. 4A and 4B benefits from a compactness in the Y dimension corresponding to a difference in width of a break versus the width of dummy word line transistors represented by boxes 404, 409. The width of each of the transistors represented by boxes 404, 409 along the length dimension of the bit lines is placed between the common nodes 312, 313 and fits between the common nodes 312, 313. Thus, the implementations of FIGS. 1-5 provide for space savings that add up as more transistors are added in the Y dimension and as more columns are added in the X dimension for a given ROM cell array design.

Figure 5:
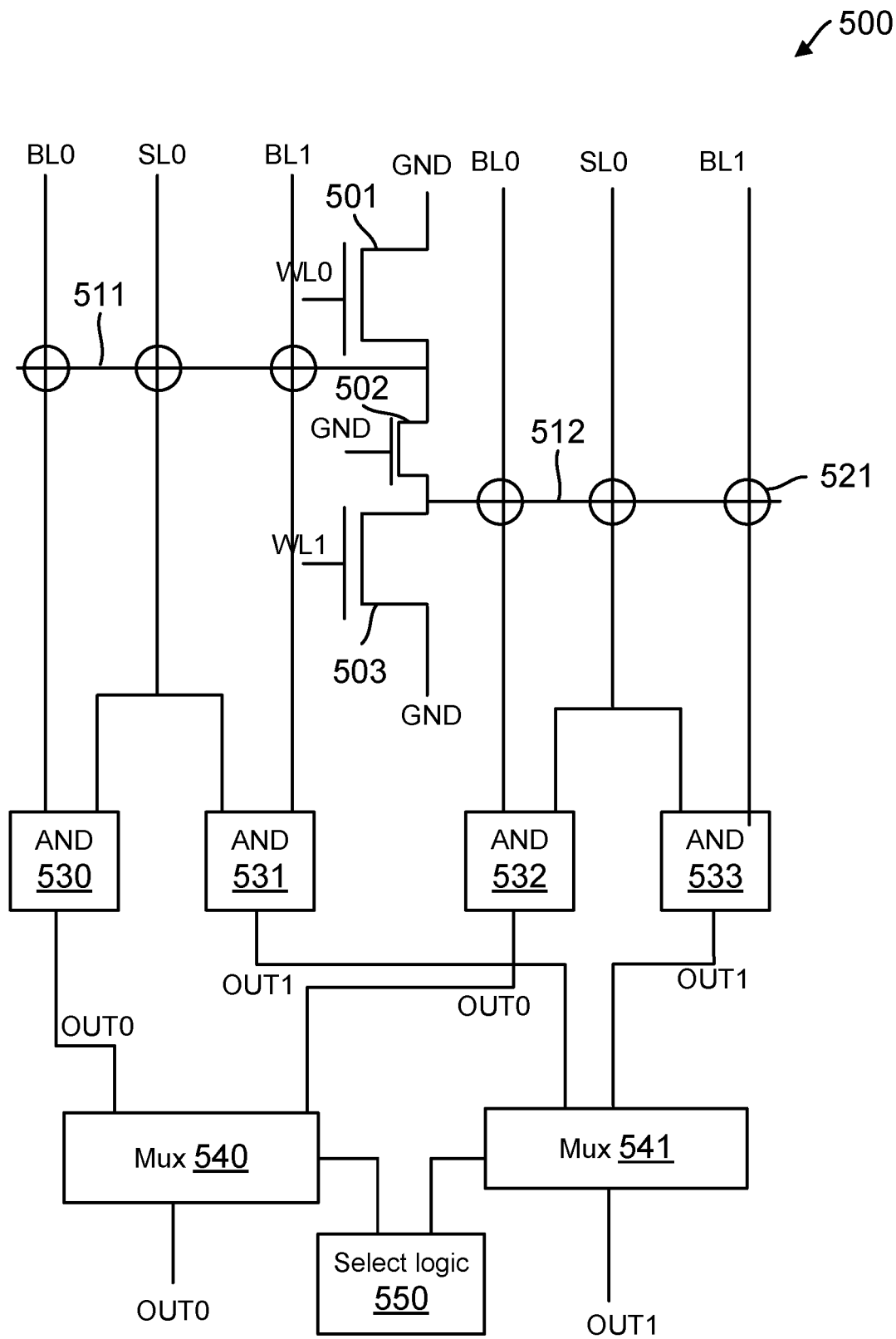
FIG. 5 is an illustration of an example ROM cell array, according to one implementation.

Although FIGS. 4A and 4B show the structure of FIG. 3, it is understood that the physical structures and their arrangement are applicable to the other implementations of FIGS. 1-2 and 5. Specifically, source lines, bit lines, word lines, ground rails, and transistors may be built in a semiconductor chip using semiconductor materials and metals in the manner shown in FIGS. 4A and 4B. Furthermore, the scope of implementations is not limited to any particular transistor width.

FIG. 5 is a simplified diagram illustrating an example ROM cell array 500, according to one implementation. FIG. 5 shows an example in which each of the word line transistors 501, 503 store a pair of bits using a separate and respective set of bit lines. By contrast, the examples of FIGS. 1-3 use bit lines that are common to a plurality of word line transistors. Nevertheless, each of the examples of FIGS. 1-3 may be adapted to instead use separate and respective bit lines.

Looking at word line transistor 501 first, it is coupled to common node 511, and it stores a pair of bits using source line SL0 and bit lines BL0, BL1 and common node 511. Logic gates 530, 531 operate in a similar manner as logic gates 230, 231 described above with respect to FIG. 2. Vias, as exemplified by via 521, may be either included or omitted according to the truth table of FIG. 2.

Now looking at word line transistor 503, it stores a pair of bits using another set of bit lines and a source line also labeled BL0, BL1, SL0 and common node 512. Logic gates 532, 533 operate in a manner similar to logic gates 230, 231 described above with respect to FIG. 2. The vias may be either included or omitted according to the truth table of FIG. 2. The select logic 550 and multiplexers 540, 541 may be used to select the final multiplexed output to decide between odd/even word line output.

A difference between the implementation of FIG. 5 and the implementation of the left or right-hand columns of FIG. 2 is that the implementation of FIG. 5 doubles the number of metal tracks by doubling the number of bit lines and source lines. An advantage of the implementation of FIG. 5 is that it may reduce parasitic capacitance and speed up performance. Specifically, if a given ROM cell array is storing numerous digital zeros, it would be expected to have numerous vias, and more vias placed on a given bit line would be expected to cause more parasitic capacitance. The implementations of FIG. 5 may reduce that parasitic capacitance by limiting the number of word line transistors that are served by a given set of bit lines and source lines. Reduce parasitic capacitance may lead to faster performance. On the other hand, the doubling of metal tracks may increase a footprint of the ROM cell array. Various designs may balance ROM cell array footprint versus performance as appropriate.

Figure 6:
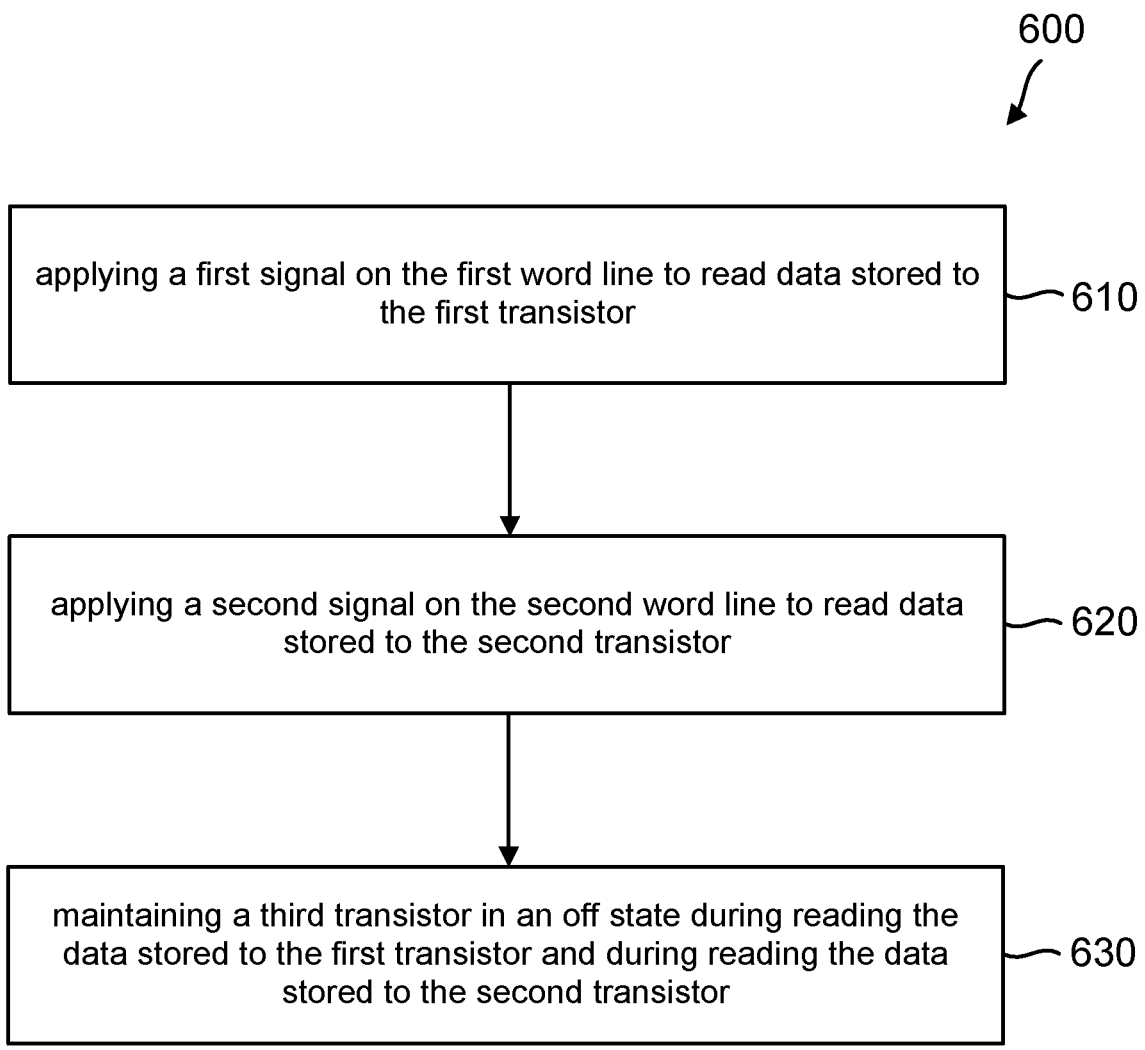
FIG. 6 is an illustration of a flow diagram of an example method of reading data from a ROM cell array, according to one implementation.

A flow diagram of an example method 600 of reading data from a ROM memory cell is illustrated in FIG. 6. In one example, method 600 may be performed by any of the implementations of FIGS. 1-5. Method 600 may be performed at boot up of the processing device, subsequent to a successful boot up of the processing device, or any other time. Furthermore, method 600 may be performed under control of other logic in the chip during boot up, such as processing core logic responsible for booting.

At action 610, a first signal is applied on the first word line to read data stored to the first transistor. For instance, a decoder, such as decoder 150 of FIG. 1, may assert a word line signal, thereby turning a word line transistor on and either discharging or not discharging a bit line. In some implementations, when the word line transistor turns on, it may be associated with a plurality of bit lines and a source line, such as shown in FIGS. 2-5, and one or more of those lines may be either discharged or not discharged. Whether a bit line or source line is discharged or not discharged may depend on whether the bit line or source line has an electrical contact with a common node, such as by via. In any event, action 610 may include reading one or more bits of data that are stored to the first transistor.

Furthermore, a sense amplifier or other circuit may be used to detect whether the bit line or source line is discharged. This was described in more detail above with respect to FIG. 1.

At action 620, a second signal is applied on a second word line to read data stored to the second transistor. The second transistor is different from the first transistor, and the second word line is different from the first word line. Furthermore, in this implementation, one bit line is selected at a time. The action 620 may be the same as or similar to the action 610.

At action 630, a third transistor is maintained in an off state while the data is read from the first transistor and while the data is read from the second transistor. An example is shown in FIG. 1, in which dummy word line transistor 105 isolates word line transistor 105 from word line transistor 103 by remaining in an off state. The other ROM cell arrays of FIGS. 2 through 5 show additional examples in which a dummy word line transistor may isolate two word line transistors from each other.

The third transistor may be maintained in an off state using any appropriate technique. In one example, the third transistor may include an NMOS transistor, which is gate-coupled to a ground rail. In another example, the third transistor may include a PMOS transistor, which is gate-coupled to VDD or other power rail. In both instances, the third transistor is maintained in an off state when the chip is powered up.

The scope of implementations is not limited to the specific method shown in FIG. 6. Other implementations may add, omit, rearrange, or modify one or more actions. For instance, method 600 may performed multiple times beginning at boot up of the processing device and then performed subsequent times during operation of the processing device.

The ROM cell arrays of FIGS. 1-5 may be used in a variety of applications. One such application is described in more detail with respect to FIG. 7, in which the ROM unit 790 provides access to secure data, such as boot code, security code, configurations, and the like within a system on chip (SOC).

Figure 7:
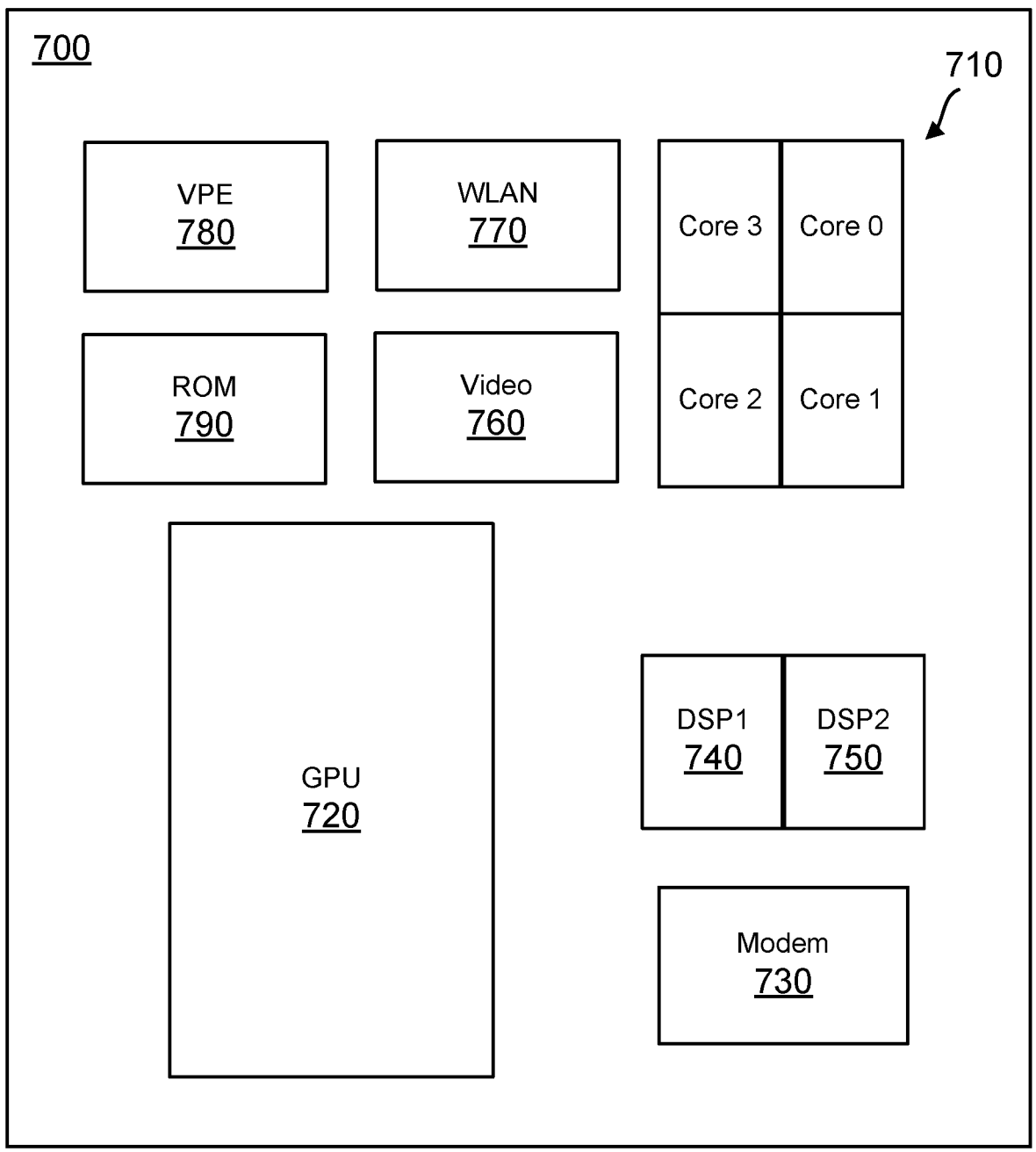
FIG. 7 is an illustration of an example system on chip (SOC), in which may be built a ROM unit including multiple ROM cell arrays, according to one implementation.

FIG. 7 is an illustration of example SOC 700, according to one implementation. In this example, SOC 700 is implemented on a semiconductor die, and it includes multiple system components 710-790. Specifically, in this example, SOC 700 includes central processing unit (CPU) 710 that is a multi-core general-purpose processor having four processor cores, core 0-core 3. Of course, the scope of implementations is not limited to any particular number of cores, as other implementations may include two cores, eight cores, or any other appropriate number of cores in the CPU 710. SOC 700 further includes other system components, such as a first digital signal processor (DSP) 740, a second DSP 750, a modem 730, graphics processing unit (GPU) 720, a video subsystem 760, a wireless local area network (WLAN) transceiver 770, and a video-front-end (VFE) subsystem 780.

SOC 700 also includes ROM memory unit 790. In this example, ROM memory unit 790 may include one or more ROM cell arrays that correspond to the architectures described above with respect to FIGS. 1-5. Specifically, ROM memory unit 790 may include numerous ROM cell arrays to provide multiple megabytes or multiple gigabytes of code available to the other components 710-780 during boot up or at other appropriate times. However, the scope of implementation is not limited to any size for ROM memory unit 790, as megabytes and gigabytes are given as examples.

In one example, boot up logic implemented in one or more of the cores 0-3 may control ROM unit 790 to access the code therein. However, the scope of implementations is not limited to boot up logic located in a particular location within SOC 700, as boot up logic may be implemented as a standalone unit or integrated into any of component 710-790.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A Read Only Memory (ROM) cell array comprising:
a first transistor coupled to a first word line;
a second transistor coupled to a second word line;
a third transistor disposed between the first transistor and the second transistor, the third transistor having a first gate terminal permanently coupled to a power rail;

a fourth transistor coupled to a third word line, the fourth transistor being coupled to the second transistor on a side opposite the third transistor; and a fifth transistor coupled to the fourth transistor and having a second gate terminal permanently coupled to the power rail.

2. The ROM cell array of claim 1, wherein the power rail is at voltage drain-drain (VDD), and wherein the first transistor, the second transistor, and the third transistor each comprises a P-channel Metal Oxide Semiconductor (PMOS) transistor.

3. The ROM cell array of claim 1, wherein the power rail comprises a voltage source-source (VSS), and wherein the first transistor, the second transistor, and the third transistor each a comprise a N-channel Metal Oxide Semiconductor (NMOS) transistor.

4. The ROM cell array of claim 1, wherein the first transistor, the second transistor, the third transistor, the fourth transistor, and the fifth transistor are coupled in series.

5. The ROM cell array of claim 1, wherein the first transistor stores a first bit of data and the second transistor stores a second bit of data.

6. A Read Only Memory (ROM) cell array comprising:
a first transistor coupled to a first word line;
a second transistor coupled to a second word line;
a third transistor disposed between the first transistor and the second transistor, the third transistor having a first gate terminal permanently coupled to a power rail
a first bit line, a second bit line, and a first source line; and
a first logic gate and a second logic gate, the first logic gate coupled to the first source line and the first bit line and configured to output a first bit stored by the first transistor, the second logic gate coupled to the first source line and the second bit line and configured to output a second bit stored by the first transistor.

7. The ROM cell array of claim 6, further comprising a via connecting a terminal of the first transistor to the first bit line.

8. The ROM cell array of claim 6, further comprising a via connecting a terminal of the first transistor to the second bit line.

9. The ROM cell array of claim 6, further comprising a via connecting a terminal of the first transistor to the first source line.

10. The ROM cell array of claim 6, further comprising: a third bit line, a fourth bit line, and a second source line; and
a third logic gate and a fourth logic gate, the third logic gate coupled to the second source line and the third bit line and configured to output a third bit stored by the second transistor, the fourth logic gate coupled to the second source line and the fourth bit line and configured to output a fourth bit stored by the second transistor.

11. The ROM cell array of claim 6, wherein the first logic gate is configured to output a third bit stored by the second transistor, and wherein the second logic gate is configured to output a fourth bit stored by the second transistor.

12. The ROM cell array of claim 6, wherein the first logic gate and the second logic gate are common to the first transistor and the second transistor.

13. A method of reading a read-only memory (ROM) cell array having a first transistor corresponding to a first word line and a second transistor corresponding to a second word line, the method comprising:
applying a first signal on the first word line to read data stored to the first transistor;
applying a second signal on the second word line to read data stored to the second transistor; and
maintaining a third transistor in an off state during reading the data stored to the first transistor and during reading the data stored to the second transistor, wherein the third transistor is disposed in series between the first transistor and the second transistor;
wherein the ROM cell is further arranged to have a fourth transistor coupled to a third word line, the fourth transistor being coupled to the second transistor on a side opposite the third transistor, and a fifth transistor coupled to the fourth transistor and having a second gate terminal permanently coupled to a power rail.

14. The method of claim 13, wherein the first transistor stores a first pair of bits and wherein the second transistor stores a second pair of bits.

15. The method of claim 13, wherein the first transistor stores a first single bit and wherein the second transistor stores a second single bit.

16. A system on chip (SOC) having a read only memory (ROM) unit, the ROM unit comprising:
a first group of transistors, each storing data and coupled to a first group of word lines;
a second group of transistors, each storing data and coupled to a second group of word lines; and
a dummy word line transistor isolating the first group of transistors from the second group of transistors, the dummy word line transistor being permanently in an off state, wherein a first transistor within the first group of transistors is associated with a first bit line, a second bit line, and a first source line and configured to store two binary bits, and wherein a second transistor within the second group of transistors is associated with a third bit line, fourth bit line, and a second source line and configured to store two binary bits.

17. The SOC of claim 16, wherein the dummy word line transistor comprises a P-channel Metal Oxide Semiconductor (PMOS) transistor, and wherein a gate of the dummy word line transistor is coupled to a power rail at voltage drain-drain (VDD).

18. The SOC of claim 16, wherein the dummy word line transistor comprises a N-channel Metal Oxide Semiconductor (NMOS) transistor, and wherein a gate of the dummy word line transistor is coupled to ground.

19. The SOC of claim 16, wherein each transistor within the first group of transistors stores two binary bits.

20. The SOC of claim 16, wherein each transistor within the second group of transistors stores two binary bits.

21. A read only memory (ROM) cell array comprising:
first means for storing first data, the first means associated with a first word line and a first bit line;
second means for storing second data, the second means associated with a second word line and a second bit line; and
means for isolating the first means from the second means, the isolating means being arranged between the first means and the second means on a semiconductor substrate, the first means, the second means, and the isolating means being arranged along a length dimension of the first bit line and the second bit line, the isolating means including a transistor configured to be held permanently in an off state during operation of a chip on which the ROM cell array is implemented;
third means for storing third data, the third means associated with a third word line, the third means being coupled to the second means on a side opposite the isolating means; and an additional isolating means for isolating the third means, the additional isolating means being coupled to the third means and having a gate terminal permanently coupled to a power rail.

22. The ROM cell array of claim 21, wherein the first means comprises a first transistor configured to store a single bit of data.

23. The ROM cell array of claim 21, wherein the second means comprises first transistor configured to store a single bit of data.

24. The ROM cell array of claim 21, wherein the first means comprises a first transistor configured to store multiple bits of data.

25. The ROM cell array of claim 21, wherein the second means comprises a first transistor configured to store multiple bits of data.

26. The ROM cell array of claim 21, wherein a width of the isolating means along the length dimension of the first bit line and the second bit line is placed between a common node of the first means and a common node of the second means.

\* \* \* \* \*

UNITED STATES PATENT AND TRADEMARK OFFICE
CERTIFICATE OF CORRECTION

Page 1 of 1

PATENT NO. : 11,114,175 B1
APPLICATION NO. : 16/986541
DATED : September 7, 2021
INVENTOR(S) : Singh et al.

It is certified that error appears in the above-identified patent and that said Letters Patent is hereby corrected as shown below:

In the Drawings

Sheet 2, FIG. 2, and on the title page, in the print figure, delete "No Via" and replace with "Via" in the 3rd row of the table under the BL0 column Signed and Sealed this
Fifteenth Day of March, 2022

Drew Hirshfeld
*Performing the Functions and Duties of the
Under Secretary of Commerce for Intellectual Property and
Director of the United States Patent and Trademark Office*